(12) United States Patent
Umeno et al.

(10) Patent No.: US 10,044,024 B2
(45) Date of Patent: Aug. 7, 2018

(54) APPARATUS FOR MANUFACTURING NEGATIVE-ELECTRODE CARBON MATERIAL, AND METHOD FOR MANUFACTURING NEGATIVE-ELECTRODE CARBON MATERIAL USING SAME

(71) Applicant: NIPPON POWER GRAPHITE CO., LTD., Tokyo (JP)

(72) Inventors: Tatsuo Umeno, Fukuoka (JP); Tadanori Tsunawaki, Fukuoka (JP); Shinya Okabe, Fukuoka (JP); Shirou Oie, Fukuoka (JP); Jyugo Sumitomo, Fukuoka (JP); Shigeyosi Nakano, Fukuoka (JP)

(73) Assignee: NIPPON POWER GRAPHITE CO., LTD., Tokyo (JP)

( * ) Notice: Subject to any disclaimer, the term of this patent is extended or adjusted under 35 U.S.C. 154(b) by 0 days.

(21) Appl. No.: 15/697,851

(22) Filed: Sep. 7, 2017

(65) Prior Publication Data
US 2018/0013127 A1    Jan. 11, 2018

Related U.S. Application Data

(63) Continuation of application No. 14/423,849, filed as application No. PCT/JP2013/072924 on Aug. 27, 2013.

(30) Foreign Application Priority Data

Aug. 29, 2012   (JP) .................................. 2012-188213

(51) Int. Cl.
*H01M 4/04*     (2006.01)
*C09C 1/56*     (2006.01)
(Continued)

(52) U.S. Cl.
CPC ........... *H01M 4/0428* (2013.01); *C01B 32/05* (2017.08); *C09C 1/56* (2013.01); *C23C 16/442* (2013.01);
(Continued)

(58) Field of Classification Search
CPC .. H01M 4/0428; H01M 4/604; H01M 4/0471; H01M 4/04; H01M 4/606;
(Continued)

(56) References Cited

U.S. PATENT DOCUMENTS

| 4,985,068 A | 1/1991 | Hoffmann et al. |
| 5,094,185 A | 3/1992 | Simopoulos et al. |

(Continued)

FOREIGN PATENT DOCUMENTS

| JP | 2000-106182 A | 4/2000 |
| JP | 2001-202961 A | 7/2001 |

(Continued)

OTHER PUBLICATIONS

International Search Report issued in PCT/JP2013/072924, dated Oct. 8, 2013.

*Primary Examiner* — Jeffrie R Lund
(74) *Attorney, Agent, or Firm* — Norris McLaughlin & Marcus P.A.

(57) ABSTRACT

An apparatus for manufacturing a lithium-ion secondary cell negative-electrode carbon material by heat-treating carbon particles while causing the carbon particles to flow within a heat-treatment furnace, the apparatus having a heat-treatment furnace provided with a carbon-particle supply opening for supplying the carbon particles into the interior, and a negative-electrode carbon material recovery opening for taking out the negative-electrode carbon material from the interior and a cooling tank connected in an airtight manner to the negative-electrode carbon material recovery opening (Continued)

US 10,044,024 B2
Page 2 of the heat-treatment furnace, and provided with a cooling means.

3 Claims, 4 Drawing Sheets

(51) Int. Cl.
| | |
|---|---|
| C23C 16/44 | (2006.01) |
| H01M 4/583 | (2010.01) |
| H01M 4/60 | (2006.01) |
| H01M 4/1393 | (2010.01) |
| H01M 10/0525 | (2010.01) |
| C01B 31/02 | (2006.01) |
| H01M 4/587 | (2010.01) |
| C23C 16/442 | (2006.01) |
| C01B 32/05 | (2017.01) |

(52) U.S. Cl.
CPC .......... C23C 16/4417 (2013.01); H01M 4/04 (2013.01); H01M 4/0471 (2013.01); H01M 4/1393 (2013.01); H01M 4/583 (2013.01); H01M 4/587 (2013.01); H01M 4/602 (2013.01); H01M 4/604 (2013.01); H01M 4/606 (2013.01); H01M 10/0525 (2013.01); *C01P 2006/40* (2013.01); *Y02T 10/7011* (2013.01)

(58) Field of Classification Search
CPC .... H01M 4/583; H01M 4/1393; H01M 4/602; H01M 10/0525; H01M 4/587; C23C 16/4417; C23C 16/422; C01B 31/02; Y02E 60/122; Y02T 10/7011

USPC ........................................................ 118/716
See application file for complete search history.

(56) References Cited

U.S. PATENT DOCUMENTS

| | | | |
|---|---|---|---|
| 5,149,062 A | 9/1992 | Matsuo et al. | |
| 6,117,772 A | 9/2000 | Murzin et al. | |
| 6,328,804 B1 | 12/2001 | Murzin et al. | |
| 6,432,583 B1 | 8/2002 | Fukuda et al. | |
| 7,939,028 B2 | 5/2011 | Ohashi et al. | |
| 2008/0160191 A1 | 7/2008 | Gao et al. | |
| 2010/0022764 A1 | 1/2010 | Otoshi et al. | |
| 2010/0068123 A1 | 3/2010 | Edwin et al. | |
| 2010/0324157 A1 | 12/2010 | Bauman et al. | |
| 2011/0137093 A1 | 6/2011 | Martens et al. | |
| 2011/0189078 A1 | 8/2011 | Ohashi et al. | |
| 2011/0226603 A1 | 9/2011 | Peus | |
| 2013/0036713 A1 | 2/2013 | Daute et al. | |
| 2014/0234197 A1 | 8/2014 | Morita et al. | |
| 2015/0303447 A1* | 10/2015 | Umeno | C23C 16/442 427/122 |
| 2016/0268593 A1 | 9/2016 | Vogler et al. | |
| 2016/0298234 A1 | 10/2016 | Yang | |
| 2017/0054146 A1 | 2/2017 | Frianeza-Kullberg et al. | |
| 2018/0013127 A1* | 1/2018 | Umeno | H01M 4/606 |

FOREIGN PATENT DOCUMENTS

| | | |
|---|---|---|
| JP | 2001-213615 A | 8/2001 |
| JP | 3597099 B | 12/2004 |
| WO | 2007/094114 A1 | 8/2007 |

\* cited by examiner

APPARATUS FOR MANUFACTURING NEGATIVE-ELECTRODE CARBON MATERIAL, AND METHOD FOR MANUFACTURING NEGATIVE-ELECTRODE CARBON MATERIAL USING SAME

CROSS REFERENCE TO RELATED APPLICATION

This application is a continuation of U.S. Ser. No. 14/423,849 filed Feb. 25, 2015 which is a 371 application of PCT/JP2013/072924 filed Aug. 27, 2013, which claims foreign priority benefit under 35 U.S.C. 119 of Japanese Application No. 2012-188213 filed Aug. 29, 2012, which are all incorporated herein by reference in their entirety.

TECHNICAL FIELD

The present invention relates to an apparatus for manufacturing a negative-electrode carbon material, and a method for manufacturing a negative-electrode carbon material by using the apparatus. Specifically, the present invention relates to an apparatus for manufacturing a negative-electrode carbon material produced by carbonizing a pulverized and classified carbon-based precursor, and a method for manufacturing a negative-electrode carbon material by using the apparatus. In addition, the present invention also relates to an apparatus for manufacturing a negative-electrode carbon material including carbon particles and a pyrolyzed carbon deposited onto the surface of the carbon particles by a chemical vapor deposition method (a CVD method), and a method for manufacturing a negative-electrode carbon material by using the apparatus.

BACKGROUND ART

A lithium-ion secondary battery is widely used as a secondary battery having a high capacity and a high voltage for a camera, a personal computer, an electric automobile or the like. The negative-electrode carbon material composing the negative-electrode of a lithium-ion secondary battery influences the performance of a lithium-ion secondary battery. As the negative-electrode carbon material for a lithium-ion secondary battery, a carbon-based negative-electrode carbon material or a graphite-based negative-electrode carbon material is known.

The carbon-based negative-electrode carbon material is classified into a hard carbon-based one and a soft carbon-based one. Pulverizing, classifying and carbonizing a phenolic resin, a naphthalene sulfonic acid resin, polyvinylidene chloride, carboxymethylcellulose, a polyacrylonitrile resin or the like result in the hard carbon-based negative-electrode material. Pulverizing, classifying and carbonizing polyvinyl chloride, a gilsonite coke, a petroleum or coal mesophase pitch and a petroleum coke or a coal pitch coke obtained by carbonizing the pitch at 300 to 500° C. (a calcination treatment) or the like result in the soft carbon-based negative-electrode material.

As the graphite-based negative-electrode carbon material, a negative-electrode carbon material for a lithium-ion secondary battery having a reduced surface area is known, in which the surface of graphite particles is vapor-deposited with a pyrolyzed carbon by a CVD method (Patent Literature 1). In addition, a carbon-based negative-electrode carbon material having a reduced surface area is also known, in which the surface of a carbon-based negative-electrode carbon material obtained as described above is vapor-deposited with a pyrolyzed carbon by a CVD method.

FIG. 5 is a block diagram illustrating an example of an apparatus for manufacturing a negative-electrode carbon material with the use of a conventional chemical vapor deposition furnace. In FIG. 5, the reference sign 900 represents a conventional apparatus for manufacturing a negative-electrode carbon material, and to a cylindrical chemical vapor deposition furnace 91, a graphite-particle supply opening 97 and a negative-electrode carbon material recovery opening 99 are formed. Within the chemical vapor deposition furnace 91, stirring blades 93 driven by a motor 95 are provided, which stir the interior of the chemical vapor deposition furnace 91. To the chemical vapor deposition furnace 91, a carbon vapor deposition source supply opening a for supplying a source for carbon vapor deposition, along with an inert gas, into the chemical vapor deposition furnace 91, an inert gas supply opening b for supplying an inert gas to the interior of the chemical vapor deposition furnace 91, and a gas exhaust opening c for exhausting a gas within the chemical vapor deposition furnace 91 to the exterior of the furnace 91 are provided. To the chemical vapor deposition furnace 91, a heater for heating the interior of the chemical vapor deposition furnace 91 is provided (not illustrated). The negative-electrode carbon material recovery opening 99 is connected via an on-off valve 101 to a container 103.

By using this apparatus for manufacturing a negative-electrode carbon material, a negative-electrode carbon material is manufactured as follows. First of all, to the interior of the chemical vapor deposition furnace 91, graphite particles are supplied. The graphite particles supplied to the interior of the chemical vapor deposition furnace 91 are heated by the non-illustrated heater, while being in a fluid condition within the chemical vapor deposition furnace 91 by the ascending current of an inert gas supplied through the inert gas supply opening b, and the stirring caused by the stirring blades 93. When the temperature within the chemical vapor deposition furnace 91 reaches 650 to 1200° C., a source for carbon vapor deposition is supplied through the carbon vapor deposition source supply opening a to the interior of the chemical vapor deposition furnace 91. The source for carbon vapor deposition supplied to the interior of the chemical vapor deposition furnace 91 comes into contact with the surface of the graphite particles, along with pyrolyzes, thereby being vapor-deposited onto the surface of the graphite particles. In this way, the graphite particles onto the surface of which the pyrolyzed carbon is vapor-deposited, in other words the negative-electrode carbon material, are obtained. The interior of the chemical vapor deposition furnace 91 is in a non-oxidizing atmosphere by an inert gas supplied through the inert gas supply opening b, in order to prevent rapid oxidation of the graphite particles or the negative-electrode carbon material. The negative-electrode carbon material formed within the chemical vapor deposition furnace 91 by the above described chemical vapor-depositing treatment is cooled under the non-oxidizing atmosphere within the chemical vapor deposition furnace 91, until the temperature reaches a temperature at which the negative-electrode carbon material is not oxidized even under an oxygen-containing atmosphere. Therefore, the temperature within the chemical vapor deposition furnace 91 after the negative-electrode carbon material is taken out from the chemical vapor deposition furnace 91 decreases to 500° C. or lower.

When a plurality of batches of negative-electrode carbon materials are manufactured by using this conventional apparatus 900 for manufacturing a negative-electrode carbon material, the temperature within the chemical vapor deposition furnace 91 in supplying graphite particles to the interior of the chemical vapor deposition furnace 91 lowers. Accordingly, the temperature within the furnace must be recovered (raised) to a temperature at which the chemical vapor-depositing treatment may be initiated. Note that, when carbon-based precursor particles are burned, a supply of the source for carbon vapor deposition through the carbon vapor deposition source supply opening a provided to the chemical vapor deposition furnace 91 is unnecessary, but only a supply of an inert gas supplied through the inert gas supply opening b is sufficient for the carbonizing treatment. From the above described burned carbon, the negative-electrode carbon material may be obtained onto which a pyrolyzed carbon has been chemically vapor-deposited with the use of the chemical vapor deposition furnace, like the graphite particles. Using the chemical vapor deposition furnace makes it also possible to carry out a carbonizing treatment and a chemical vapor-depositing treatment in parallel.

Because the above described cooling and temperature-raising steps are included, in a process for manufacturing a negative-electrode carbon material, the using time of the chemical vapor deposition furnace and the carbonizing furnace is long. Therefore, the productive efficiency is poor.

CITATION LIST

Patent Literature

Patent Literature 1: JP 3597099 B1

SUMMARY OF INVENTION

Technical Problem

An object of the present invention is to provide a negative-electrode carbon material manufacturing apparatus for effectively manufacturing a negative-electrode carbon material by shortening the using time of a heat-treatment furnace such as a carbonizing furnace or a chemical vapor deposition furnace for the steps (cooling and temperature-raising) other than the heat-treatment (carbonizing or chemical vapor-depositing treatment) in manufacturing a negative-electrode carbon material, and a method for manufacturing a negative-electrode carbon material by using the apparatus.

Solution to Problem

The present inventors have performed examination to solve the above described problems. As a result, the present invention has been achieved based on the finding that connecting a cooling tank including a cooling means to the heat-treatment furnace in an airtight manner may maintain the heat-treatment furnace at a high temperature, and thus effectively manufacture a negative-electrode carbon material.

The present invention for solving the above described problems is mentioned below.

[1] An apparatus for manufacturing a negative-electrode carbon material for a lithium-ion secondary battery by heat-treating (carbonizing or chemical vapor deposition treating) carbon particles (graphite particles or carbon-based precursor particles) while causing the above described carbon particles to flow within a heat-treatment furnace, the apparatus for manufacturing a negative-electrode carbon material for a lithium-ion secondary battery including a heat-treatment furnace (a carbonizing furnace or a chemical vapor deposition furnace) provided with a carbon-particle supply opening for supplying the carbon particles to the interior, and a negative-electrode carbon material recovery opening for taking out the negative-electrode carbon material from the interior, and a cooling tank connected in an airtight manner to the negative-electrode carbon material recovery opening of the above described heat-treatment furnace, and provided with a cooling means.

[2] The apparatus for manufacturing a negative-electrode carbon material according to [1], wherein the heat-treatment furnace is a carbonizing furnace or a chemical vapor deposition furnace.

[3] The apparatus for manufacturing a negative-electrode carbon material for a lithium-ion secondary battery according to [1], wherein, to the carbon-particle supply opening, a preheating tank provided with a means that preliminarily heats the carbon particles is connected.

[4] A method for manufacturing a negative-electrode carbon material for a lithium-ion secondary battery, including a carbon-particle supplying step of supplying carbon particles (graphite particles or carbon-based precursor particles) to the interior of a heat-treatment furnace, a heat-treating step of heat-treating (carbonizing or chemical vapor deposition treating) the above described carbon particles to 650° C. or higher while causing the particles to flow within the above described heat-treatment furnace to produce the negative-electrode carbon material, a negative-electrode carbon material transporting step of transporting the negative-electrode carbon material produced in the heat-treating step from the interior of the above described heat-treatment furnace (a carbonizing furnace or a chemical vapor deposition furnace) to a cooling tank, and repeating these steps sequentially, the method for manufacturing a negative-electrode carbon material, wherein the carbon-particle supplying step carried out after the negative-electrode carbon material transporting step supplies carbon particles to the interior of the above described heat-treatment furnace having a temperature of 650° C. or higher.

[5] The method for manufacturing a negative-electrode carbon material for a lithium-ion secondary battery according to [4], wherein the above described heat-treating step is a carbonizing step of heating the above described carbon particles (carbon-based precursor particles) to 800 to 1200° C. while causing the carbon particles to flow within the heat-treatment furnace.

[6] The method for manufacturing a negative-electrode carbon material for a lithium-ion secondary battery according to [4], wherein the above described heat-treating step is a chemical vapor deposition treating step of bringing a source for carbon vapor deposition into contact with the surface of the above described carbon particles (graphite particles or carbon-based precursor particles) while causing the carbon particles to flow within the heat-treatment furnace, along with pyrolyzing the above described source for carbon vapor deposition at 650 to 1200° C. to vapor-deposit a pyrolyzed carbon onto the surface of the above described carbon particles.

[7] The method for manufacturing a negative-electrode carbon material for a lithium-ion secondary battery according to [4], wherein the carbon particles supplied to the interior of the heat-treatment furnace in the carbon-particle supplying step are carbon particles preliminarily heated to 100 to 1200° C.

[8] The method for manufacturing a negative-electrode carbon material for a lithium-ion secondary battery according to [4], wherein the carbon particles are any of a phenolic resin, a naphthalene sulfonic acid resin, polyvinylidene chloride, carboxymethylcellulose, a polyacrylonitrile resin, polyvinyl chloride, and a gilsonite coke;

a petroleum mesophase pitch or a coal mesophase pitch, and a petroleum coke or a coal pitch coke obtained by carbonizing the mesophase pitch at 300 to 500° C.; and a natural graphite and an artificial graphite.

Advantageous Effects of Invention

The apparatus for manufacturing a negative-electrode carbon material according to the present invention may, after the heat-treatment, immediately transport the negative-electrode carbon material produced within the heat-treatment furnace to the cooling tank. Therefore, the interior of the heat-treatment furnace may be maintained at a high temperature. As a result, when the negative-electrode carbon material is continually manufactured, the time required for cooling the interior of the heat-treatment furnace, as well as the time and energy required for temperature-raising the heat-treatment furnace in the manufacture for the second batch or thereafter as in the conventional case may be reduced.

DESCRIPTION OF EMBODIMENTS (1) Apparatus for Manufacturing Negative-Electrode Carbon Material An apparatus for manufacturing a negative-electrode carbon material according to the present invention includes a heat-treatment furnace and a cooling tank. The heat-treatment furnace includes a carbon-particle supply opening for supplying carbon particles to the interior of the heat-treatment furnace, and a negative-electrode carbon material recovery opening for taking out the negative-electrode carbon material from the interior of the heat-treatment furnace. The negative-electrode carbon material recovery opening of the heat-treatment furnace is connected in an airtight manner to the cooling tank. The interior volume of the cooling tank is equal to or larger than, preferably 1 to 5 times as large as the volume of carbon particles treated per batch within the heat-treatment furnace.

Figure 1:
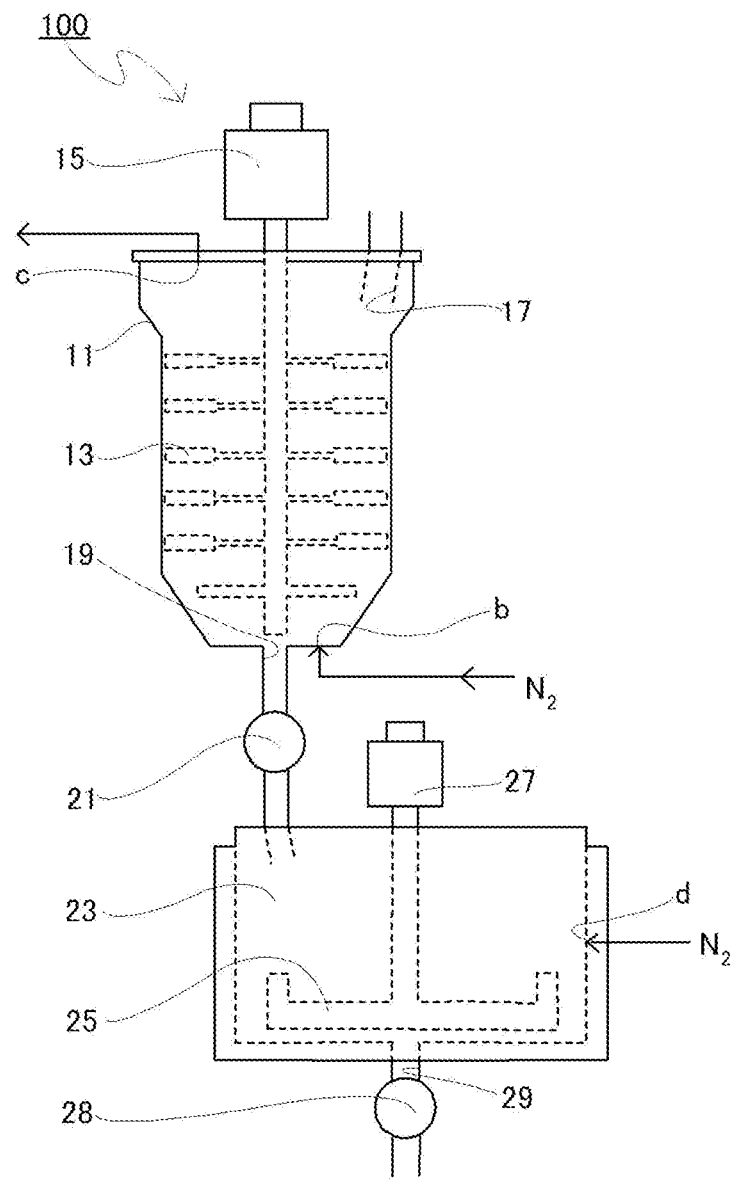
FIG. 1 is a block diagram illustrating an example of an apparatus for manufacturing a negative-electrode carbon material according to the present invention.

FIG. 1 is a block diagram illustrating an example of the apparatus for manufacturing a negative-electrode carbon material according to the present invention. In FIG. 1, the reference sign 100 represents the apparatus for manufacturing a negative-electrode carbon material according to the present invention, and at the upper part of the cylindrical heat-treatment furnace 11, the carbon-particle supply opening 17 is formed, whereas at the lower part thereof, the negative-electrode carbon material recovery opening 19 is formed. Within the heat-treatment furnace 11, stirring blades 13 driven by a motor 15 attached to the upper part of the heat-treatment furnace 11 are provided, which stir the interior of the heat-treatment furnace 11. At the bottom part of the heat-treatment furnace 11, an inert gas supply opening b for supplying an inert gas to the interior of the heat-treatment furnace 11 is formed. At the upper part of the heat-treatment furnace 11, a gas exhaust opening c for exhausting a gas within the heat-treatment furnace 11 to the exterior of the furnace 11 is formed. To the heat-treatment furnace 11, a heater that is a means that heats the interior of the heat-treatment furnace 11 to a predetermined temperature is provided along the outer periphery of the heat-treatment furnace 11 (not illustrated).

The negative-electrode carbon material recovery opening 19 is connected in an airtight manner via an on-off valve 21 to the cooling tank 23. To the outer periphery part and the bottom wall part of the cooling tank 23, a cooling jacket for cooling the interior of the cooling tank 23 by a refrigerant is provided as a cooling means. Within the cooling tank 23, stirring blades 25 driven by a motor 27 are provided, which stir the interior of the cooling tank 23. At the bottom part of the cooling tank 23, a recovery opening 29 for a negative-electrode carbon material is formed. The reference sign 28 represents a recovery opening valve for opening or closing the recovery opening 29. The reference sign d represents an inert gas supply opening for supplying an inert gas to the interior of the cooling tank 23.

Figure 2:
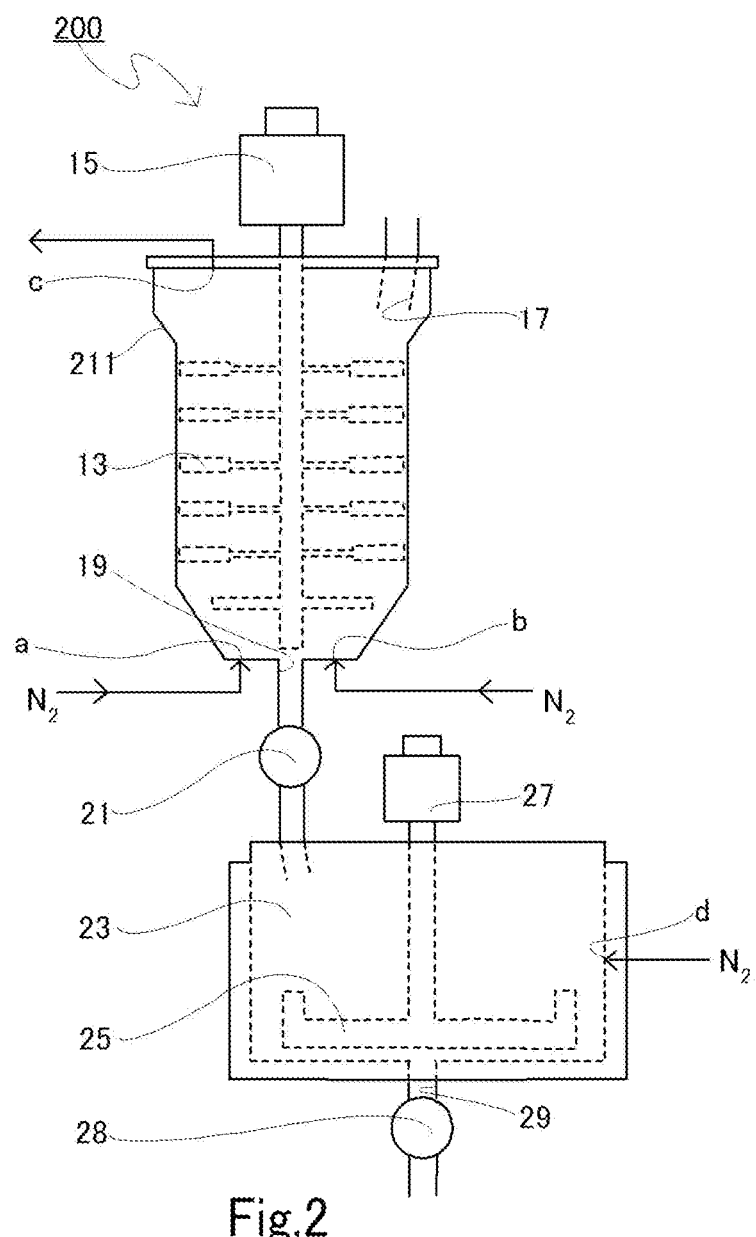
FIG. 2 is a block diagram illustrating another composition example of an apparatus for manufacturing a negative-electrode carbon material according to the present invention.

FIG. 2 is a block diagram illustrating another composition example of the apparatus for manufacturing a negative-electrode carbon material according to the present invention. This apparatus for manufacturing a negative-electrode carbon material has the heat-treatment furnace of FIG. 1 composed as a chemical vapor deposition furnace. The similar composition to that of FIG. 1 has the same reference sign as that in FIG. 1, and the description of the composition is omitted. In FIG. 2, the reference sign 200 represents the apparatus for manufacturing a negative-electrode carbon material according to the present invention, and at the bottom part of the cylindrical chemical vapor deposition furnace 211, a carbon vapor deposition source supply opening a for supplying a source for carbon vapor deposition to the interior of the chemical vapor deposition furnace 211, and the inert gas supply opening b for supplying an inert gas to the interior of the chemical vapor deposition furnace 211 are formed. Note that the carbon vapor deposition source supply opening a may be the same as the inert gas supply opening b.

Figure 3:
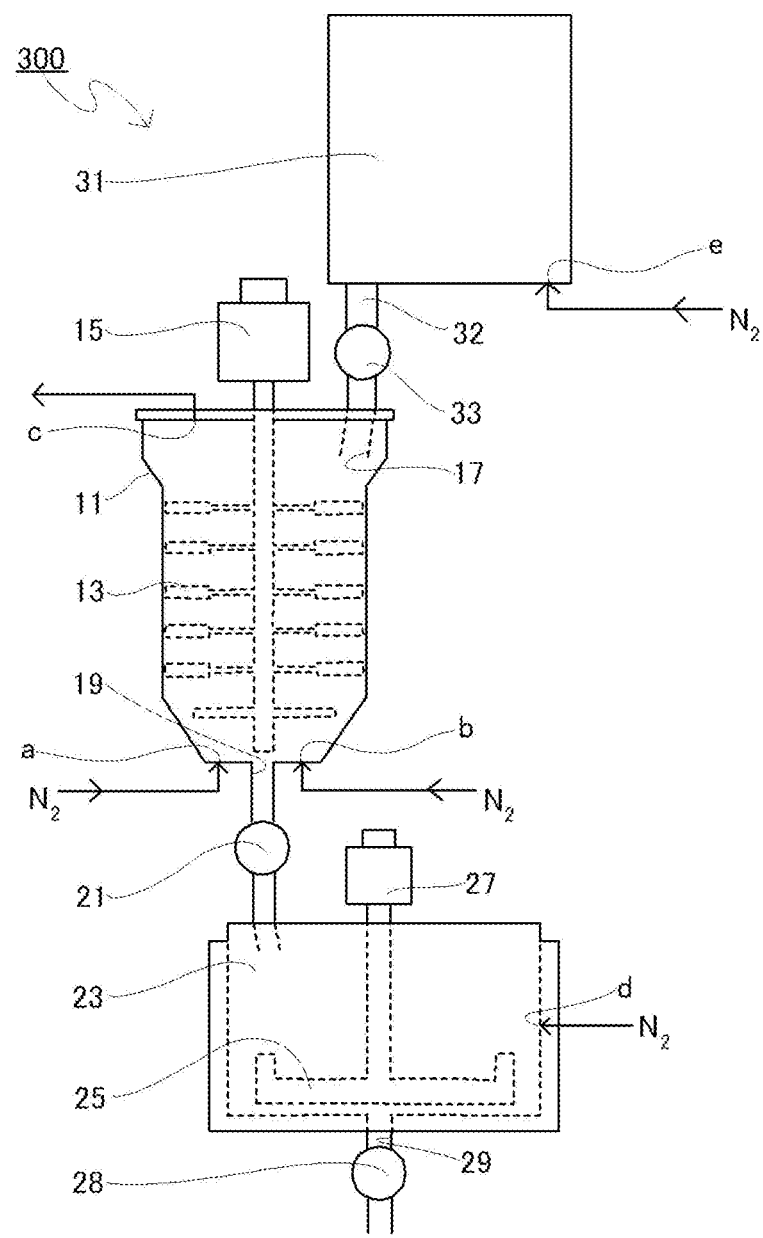
FIG. 3 is a block diagram illustrating still another composition example of an apparatus for manufacturing a negative-electrode carbon material according to the present invention.

FIG. 3 is a block diagram illustrating still another composition example of the apparatus for manufacturing a negative-electrode carbon material according to the present invention. The similar composition to that of FIG. 1 has the same reference sign as that in FIG. 1, and the description of the composition is omitted. In FIG. 3, the reference sign 300 represents the apparatus for manufacturing a negative-electrode carbon material according to the present invention, and the reference sign 31 represents a preheating tank. To the external wall of the preheating tank 31, a heater for warming the interior thereof is provided (not illustrated). The reference sign e represents an inert gas supply opening for supplying an inert gas to the interior of the preheating tank 31. To the bottom part of the preheating tank 31, one end of a supply pipe 32 is connected in an airtight manner, whereas another end thereof is connected in an airtight manner via an on-off valve 33 to the carbon-particle supply opening 17.

As the heat-treatment furnace of the apparatus for manufacturing a negative-electrode carbon material according to the present invention, a conventionally and publicly known carbonizing furnace or chemical vapor deposition furnace may be used. As the cooling tank, any container may be used, as long as the container includes a cooling jacket for cooling the interior of the tank by a refrigerant such as water, which allows the interior of the tank to be cooled under a non-oxidizing atmosphere. It is preferable that the cooling tank include a stirring device. The cooling tank may be composed with the use of, for example, a Henschel mixer which has a blade rotatable at a high speed in a cylindrical container. As the preheating tank, any container may be used, as long as the container may carry out heating and stirring under a non-oxidizing atmosphere. An example of the inert gas for forming a non-oxidizing atmosphere includes a nitrogen gas, an argon gas or a helium gas.

(2) Method for Manufacturing Negative-Electrode Carbon Material

A description is made of the following two types of methods for manufacturing two or more batches of negative-electrode carbon materials in succession by using the apparatus 100 for manufacturing a negative-electrode carbon material according to the present invention.

(2-1) Manufacture of Carbon-Based Negative-Electrode Carbon Material

Hereinafter, a description is made of a method for manufacturing a carbon-based negative-electrode carbon material, including carbonizing carbon-based precursor particles by using the apparatus 100 for manufacturing a negative-electrode carbon material according to the present invention.

This manufacturing method is a method for manufacturing a negative-electrode carbon material, including a supplying step of supplying carbon-based precursor particles to the interior of a heat-treatment furnace (a carbonizing furnace), a heat-treating step of heating the above described carbon-based precursor particles to 800 to 1200° C. while causing the particles to flow within the above described heat-treatment furnace, thereby carbonizing the above described carbon-based precursor particles to produce the negative-electrode carbon material, and a negative-electrode carbon material transporting step of transporting the negative-electrode carbon material produced in the heat-treating step from the interior of the above described heat-treatment furnace to a cooling tank, the method repeating the steps sequentially, wherein the carbon-based precursor-particle supplying step carried out after the negative-electrode carbon material transporting step supplies carbon-based precursor particles to the interior of the above described heat-treatment furnace having a temperature of 650° C. or higher.

First of all, carbon-based precursor particles are supplied to the interior of the heat-treatment furnace 11. From the manufacture for the second batch, the carbon-based precursor particles are supplied to the interior of the heat-treatment furnace 11 in accordance with the carbon-based precursor-particle supplying step as described below.

An example of the carbon-based precursor particles includes hard carbon-based precursor particles and soft carbon-based precursor particles. An example of the hard carbon-based precursor particles includes pulverized and classified particles of a phenolic resin, a naphthalene sulfonic acid resin, polyvinylidene chloride, carboxymethylcellulose, a polyacrylonitrile resin or the like. An example of the soft carbon-based precursor particles includes pulverized and classified particles of polyvinyl chloride, a gilsonite coke, a petroleum or coal mesophase pitch and a petroleum coke or a coal pitch coke obtained by carbonizing the pitch at 300 to 500° C. (a calcination treatment) or the like. The carbon-based precursor particles have a particle diameter of preferably 1 to 100 μm, more preferably 5 to 20 μm, particularly preferably 5 to 10 μm.

[Temperature-Raising Step and Heat-Treating Step]

The carbon-based precursor particles supplied to the interior of the heat-treatment furnace 11 stay in a fluid condition within the heat-treatment furnace 11 by the stirring caused by the stirring blades 13, and the ascending current of an inert gas supplied through the inert gas supply opening b and exhausted through the gas exhaust opening c. The particles are heated to 800 to 1200° C. by the heater (not illustrated), while being kept in this condition, thereby being burned. In this way, the carbon-based negative-electrode carbon material (hereinafter, also referred to merely as "negative-electrode carbon material") is obtained. During this time, the interior of the heat-treatment furnace 11 is in a non-oxidizing atmosphere by an inert gas supplied through the inert gas supply opening b.

The heat-treatment temperature is from 800 to 1200° C., preferably from 950 to 1200° C. The heat-treatment time is not limited in particular, but is generally 1 to 5 hours after the temperature is raised. As the heat-treatment furnace, a conventionally and publicly known heat-treatment furnace may be used, as well as the following chemical vapor deposition furnace may be used. The pressure is not limited in particular, but is generally at an atmospheric pressure. During the heat-treatment, the on-off valve 21 is closed.

[Negative-Electrode Carbon Material Transporting Step]

The negative-electrode carbon material produced in the heat-treating step is transported from the above described heat-treatment furnace 11 having a temperature of 800 to 1200° C. to the cooling tank 23. In other words, the on-off valve 21 is opened, and the negative-electrode carbon material is transported via the on-off valve 21 to the cooling tank 23. The transportation is carried out by the free fall or with the use of a publicly known powder transporter. After completion of the transportation, the on-off valve 21 is closed.

[Cooling Step]

The negative-electrode carbon material transported to the interior of the cooling tank 23 is cooled to 100° C. or lower within the cooling tank 23. In other words, the negative-electrode carbon material transported to the interior of the cooling tank 23 is subjected to heat exchange with the refrigerant flowing within the cooling jacket of the cooling tank 23, while being stirred by the stirring blades 25, thereby being cooled. When the temperature of the negative-electrode carbon material within the cooling tank 23 is at 100° C. or lower, the material is taken out through the recovery opening 29 to the exterior of the cooling tank 23. It is preferable that the negative-electrode carbon material within the cooling tank 23 be cooled under a non-oxidizing atmosphere until the temperature reaches approximately 100° C., in order to prevent oxidation.

[Carbon-Based Precursor-Particle Supplying Step]

In the above described negative-electrode carbon material transporting step, after the whole negative-electrode carbon material within the heat-treatment furnace 11 is transported to the interior of the cooling tank 23, the on-off valve 21 is closed and new carbon-based precursor particles involved in the manufacture of the next batch are supplied to the interior of the heat-treatment furnace 11. In the manufacturing method, because the negative-electrode carbon material transporting step and the carbon-based precursor-particle supplying step are almost continually carried out, the temperature within the heat-treatment furnace 11 when the carbon-based precursor particles are supplied does not so significantly decrease that the temperature is kept at 650° C. or higher, preferably from 800 to 1200° C. When the manufacture is carried out in this way, because the temperature within the heat-treatment furnace 11 is kept high, the time and energy required for heating the interior of the heat-treatment furnace 11 to 800 to 1200° C. in the temperature-raising step are reduced.

In the manufacturing method, in the heat-treatment furnace 11, the heat-treating step, the negative-electrode carbon material transporting step and the carbon-based precursor-particle supplying step are serially carried out. When the carbon-based precursor particles supplied to the interior of the heat-treatment furnace 11 are preliminarily heated, the temperature-raising step may be further shortened or omitted. When the carbon-based precursor particles are preliminarily heated, the preheating tank 31 of the apparatus 300 for manufacturing a negative-electrode carbon material is used. In other words, to the preheating tank 31, the not-illustrated heater is provided, and with the use of this heater, the carbon-based precursor particles to be supplied to the interior of the heat-treatment furnace 11 are preliminarily heated under a non-oxidizing atmosphere. In this way, the temperature-raising step carried out within the heat-treatment furnace 11 may be shortened or omitted. When the carbon-based precursor particles are preliminarily heated, the temperature is from 100 to 1000° C., preferably from 300 to 950° C., particularly preferably from 500 to 800° C.

It is preferable that the carbon-based precursor-particle supplying step to be carried out after the negative-electrode carbon material transporting step be promptly carried out before the temperature within the heat-treatment furnace decreases, preferably carried out when the temperature is at 650° C. or higher, particularly from 800 to 1000° C.

In the manufacturing method according to the present invention, after the heat-treatment, the negative-electrode carbon material within the heat-treatment furnace is immediately transported to the cooling tank, and cooling is carried out in the cooling tank. Therefore, the temperature within the heat-treatment furnace is maintained high, so that when the negative-electrode carbon material is manufactured in succession, the time required for the temperature-raising step for the second batch or thereafter is short. In this way, the time required for the manufacture per batch may be shortened in comparison with the conventional one.

In the method for manufacturing a negative-electrode carbon material according to the present invention, the heat-treatment is carried out in such a condition that the carbon-based precursor particles are flowed by the air flow caused by the stirring blades and an inert gas supplied to the interior of the heat-treatment furnace. Therefore, the efficiency of the heat-treatment is higher, in comparison with that of a conventional heat-treatment carried out with the use of a tunnel kiln, a shuttle kiln, a pusher kiln, a top hat kiln, or a roller hearth kiln having a fixed bed. When the heat-treatment of the carbon-based precursor particles is carried out on a fluid bed in this way, the heat-treatment temperature is from 800 to 1200° C. The obtained carbon is more uniform and has less unevenness in carbonizing, in comparison with that obtained by a heat-treatment carried out with the use of a tunnel kiln, a shuttle kiln, a pusher kiln, a top hat kiln, or a roller hearth kiln. The method for manufacturing a negative-electrode carbon material according to the present invention may provide an excellent heat transfer to carbon-based precursor particles, and continually produce a carbon of high quality, with the result that the production cost is reduced.

(2-2) Manufacture of Negative-Electrode Carbon Material onto which Source for Carbon Vapor Deposition is Vapor-Deposited Hereinafter, a description is made of a method for manufacturing a negative-electrode carbon material in which carbon particles are vapor-deposited with a source for carbon vapor deposition by using the apparatus 200 for manufacturing a negative-electrode carbon material according to the present invention.

This manufacturing method is a method for manufacturing a negative-electrode carbon material, including a carbon-particle supplying step of supplying carbon particles to the interior of a chemical vapor deposition furnace, a chemical vapor deposition treating step of bringing a source for carbon vapor deposition into contact with the surface of the above described carbon particles while causing the above described carbon particles to flow within the above described chemical vapor deposition furnace, along with pyrolyzing the above described source for carbon vapor deposition at 650 to 1200° C., thereby vapor-depositing a pyrolyzed carbon onto the surface of the above described carbon particles, and a negative-electrode carbon material transporting step of transporting the negative-electrode carbon material produced in the chemical vapor deposition treating step from the above described chemical vapor deposition furnace having a temperature of 650 to 1200° C. to a cooling tank, and repeating these steps sequentially, wherein the carbon-particle supplying step carried out after the negative-electrode carbon material transporting step supplies carbon particles to the interior of the above described chemical vapor deposition furnace having a temperature of 650 to 1200° C.

First of all, carbon particles are supplied to the interior of the chemical vapor deposition furnace 211. From the manufacture for the second batch, the carbon particles are supplied to the interior of the chemical vapor deposition furnace 211 in accordance with the carbon-particle supplying step as described below.

An example of the carbon particles includes the above described carbon-based negative-electrode carbon material or graphite particles.

An example of the graphite particles includes graphite particles of a natural graphite, graphite particles of an artificial graphite or the like that is crushed if necessary, spherically-processed graphite particles, granulated graphite particles, or compacted spindle-shaped graphite particles. The graphite particles have a particle diameter of preferably 1 to 100 µm, more preferably 5 to 25 µm, particularly preferably 10 to 20 µm.

[Temperature-Raising Step]

The carbon particles supplied to the interior of the chemical vapor deposition furnace 211 stay in a fluid condition within the chemical vapor deposition furnace 211 by the stirring caused by the stirring blades 13, and the ascending current of an inert gas supplied through the inert gas supply opening b and exhausted through the gas exhaust opening c. The particles are heated to 650 to 1200° C. by the heater (not illustrated), while being kept in this condition. During this time, the interior of the chemical vapor deposition furnace 211 is in a non-oxidizing atmosphere by an inert gas supplied through the inert gas supply opening b. Completion of the temperature-raising step leads to the chemical vapor deposition treating step.
[Chemical Vapor Deposition Treating Step]

A source for carbon vapor deposition diluted with an inert gas is supplied through the carbon vapor deposition source supply opening a or the inert gas supply opening b to the interior of the chemical vapor deposition furnace 211. The source for carbon vapor deposition supplied to the interior pyrolyzes at 650 to 1200° C., along with comes into contact with the surface of the floating carbon particles within the chemical vapor deposition furnace 211 in a fluid condition. In this way, the carbon particles in which the surface of the carbon particles are vapor-deposited with the pyrolyzed carbon (hereinafter, also referred to as "negative-electrode carbon material") are obtained. During this time, the interior of the chemical vapor deposition furnace 211 is in a non-oxidizing atmosphere by an inert gas supplied through the inert gas supply opening b. In addition, during this time, the on-off valve 21 is closed.
[Negative-Electrode Carbon Material Transporting Step]

The negative-electrode carbon material produced in the chemical vapor deposition treating step is transported from the above described chemical vapor deposition furnace 211 having a temperature of 650 to 1200° C. to the cooling tank 23. In other words, the on-off valve 21 is opened, and the negative-electrode carbon material is transported via the on-off valve 21 to the cooling tank 23. The transportation is carried out by the free fall or with the use of a publicly known powder transporter. After completion of the transportation, the on-off valve 21 is closed.
[Cooling Step]

The above described negative-electrode carbon material transported to the interior of the above described cooling tank 23 is cooled to 100° C. or lower within the cooling tank 23. In other words, the negative-electrode carbon material transported to the interior of the cooling tank 23 is subject to heat exchange with the refrigerant flowing within the cooling jacket of the cooling tank 23, while being stirred by the stirring blades 25, thereby being cooled. When the temperature of the negative-electrode carbon material within the cooling tank 23 is at 100° C. or lower, the material is taken out through the recovery opening 29 to the exterior of the cooling tank 23. It is preferable that the negative-electrode carbon material within the cooling tank 23 be cooled under a non-oxidizing atmosphere until the temperature reaches approximately 100° C., in order to prevent combustion.
[Carbon-Particle Supplying Step]

After the whole negative-electrode carbon material within the chemical vapor deposition furnace 211 is transported to the cooling tank 23, the on-off valve 21 is closed and new carbon particles involved in the manufacture of the next batch are supplied to the interior of the chemical vapor deposition furnace 211. In the manufacturing method, because the negative-electrode carbon material transporting step and the carbon-particle supplying step are almost continually carried out, the temperature within the chemical vapor deposition furnace 211 when the carbon-particles are supplied does not so significantly decrease that the temperature is kept at 650 to 1200° C. When the manufacture is carried out in this way, because the temperature within the chemical vapor deposition furnace 211 is from 650 to 1200° C., the time and energy required for heating the interior of the chemical vapor deposition furnace 211 to 650 to 1200° C. in the temperature-raising step are reduced.

In the manufacturing method, in the chemical vapor deposition furnace 211, the chemical vapor deposition treating step, the negative-electrode carbon material transporting step and the carbon-particle supplying step are serially carried out. When the carbon particles supplied to the interior of the chemical vapor deposition furnace 211 are preliminarily heated, the temperature-raising step may be further shortened or omitted. When the carbon particles are preliminarily heated, the preheating tank 31 of the apparatus 300 for manufacturing a negative-electrode carbon material is used. In other words, to the preheating tank 31, the not-illustrated heater is provided, and with the use of this heater, the carbon particles to be supplied to the interior of the chemical vapor deposition furnace 211 are preliminarily heated under a non-oxidizing atmosphere. In this way, the temperature-raising step carried out within the chemical vapor deposition furnace 211 may be shortened or omitted. When the carbon particles are preliminarily heated, the temperature is from 100 to 1200° C., preferably from 300 to 1000° C., particularly preferably from 500 to 800° C.

Figure 4:
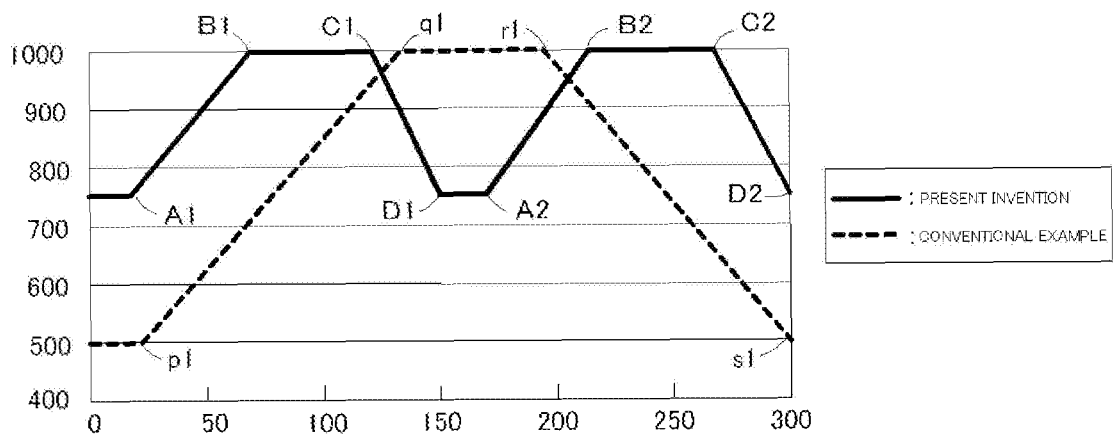
FIG. 4 is a graph illustrating an example of temperature changes within a heat-treatment furnace when a negative-electrode carbon material is manufactured in accordance with the present invention and a conventional manufacturing method.
Figure 5:
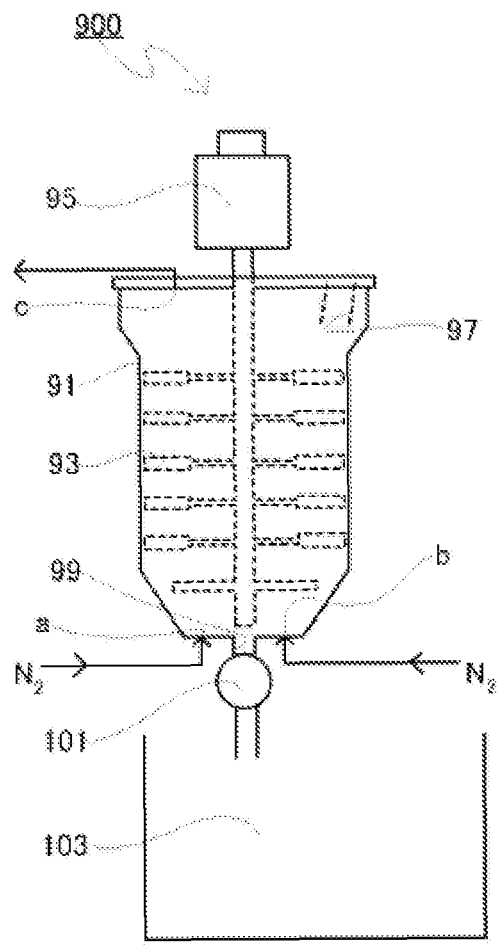
FIG. 5 is a block diagram illustrating an example of an apparatus for manufacturing a conventional negative-electrode carbon material.

FIG. 4 is a graph illustrating an example of the temperature changes within the chemical vapor deposition furnace when approximately 120 kg of the negative-electrode carbon material per batch are manufactured in accordance with the present invention and a conventional manufacturing method. In FIG. 4, the solid line represents the temperature change within the chemical vapor deposition furnace for the manufacturing method according to the present invention, and the broken line represents the temperature change within the chemical vapor deposition furnace for the conventional manufacturing method.

In FIG. 4, the reference sign p1 to the reference sign q1 correspond to a temperature-raising step in the conventional manufacturing method, in which graphite particles are heated to approximately 1000° C., while being flowed within the chemical vapor deposition furnace in a non-oxidizing atmosphere. The reference sign q1 to the reference sign r1 correspond to a chemical vapor deposition treating step in the conventional manufacturing method, in which the surface of the graphite particles is vapor-deposited with a pyrolyzed carbon within the chemical deposition furnace in a non-oxidizing atmosphere. The reference sign r1 to the reference sign s1 correspond to a cooling step in the conventional manufacturing method, in which the temperature is cooled to a temperature (approximately 500° C.) or lower that allows the negative-electrode carbon material that has undergone the chemical vapor-depositing treatment to be taken out to the exterior (an oxidizing atmosphere). The reference sign s1 corresponds to taking-out of the negative-electrode carbon material in the conventional manufacturing method, in which the chemical vapor deposition furnace is opened, and the negative-electrode carbon material is taken out from the interior of the furnace to the exterior thereof. During this time, the interior of the chemical vapor deposition furnace has a temperature of approximately 500° C. The time required for the manufacture is approximately 300 minutes per batch.

In FIG. 4, the reference sign A1 to the reference sign B1 correspond to the temperature-raising step in the manufacturing method according to the present invention, in which graphite particles are heated to approximately 1000° C., while being flowed within the chemical vapor deposition furnace in a non-oxidizing atmosphere. The reference sign B1 to the reference sign C1 correspond to the chemical vapor deposition treating step in the manufacturing method according to the present invention, in which the surface of the graphite particles is vapor-deposited with a pyrolyzed carbon within the chemical deposition furnace in a non-oxidizing atmosphere. The reference sign C1 to the reference sign D1 correspond to the negative-electrode carbon material transporting step in the manufacturing method according to the present invention, in which the negative-electrode carbon material within the chemical vapor deposition furnace is transported to the cooling tank. During this time, the temperature within the chemical vapor deposition furnace decreases to approximately 750° C. The reference sign D1 to the reference sign A2 correspond to the graphite-particle supplying step, in which graphite particles used for the manufacture of the next batch (in the drawing, the second batch) are supplied to the interior of the chemical vapor deposition furnace. The reference sign A2 to the reference sign B2 correspond to the temperature-raising step for the second batch in the manufacturing method according to the present invention, in which the graphite particles are heated to approximately 1000° C., while being flowed within the chemical vapor deposition furnace in a non-oxidizing atmosphere. The reference sign B2 to the reference sign C2 correspond to the chemical vapor deposition treating step for the second batch in the manufacturing method according to the present invention, in which the surface of the graphite particles is vapor-deposited with a pyrolyzed carbon within the chemical deposition furnace in a non-oxidizing atmosphere. The reference sign C2 to the reference sign D2 correspond to the negative-electrode carbon material transporting step for the second batch in the manufacturing method according to the present invention, in which the negative-electrode carbon material within the chemical vapor deposition furnace is transported to the cooling tank. During this time, the temperature within the chemical vapor deposition furnace decreases to approximately 750° C. The time required for the manufacture is approximately 150 minutes per batch. Note that the negative-electrode carbon material transported to the cooling tank is cooled to around 80° C. within the cooling tank. The cooling is carried out under a non-oxidizing atmosphere until the temperature reaches around 650° C. The time required for cooling to 80° C. is approximately 60 minutes. The cooling step may be advanced along with the above described temperature-raising step and chemical vapor deposition treating step in parallel.

It is preferable that the graphite-particle supplying step to be carried out after the negative-electrode carbon material transporting step be promptly carried out before the temperature within the chemical vapor deposition furnace decreases, preferably carried out when the temperature is from 650° C. to 1200° C.

In the manufacturing method according to the present invention, after the chemical vapor-depositing treatment, the negative-electrode carbon material within the chemical vapor deposition furnace is immediately transported to the cooling tank, and cooling is carried out in the cooling tank. Therefore, the temperature within the chemical vapor deposition furnace is maintained high, so that when the negative-electrode carbon material is manufactured in succession, the time required for the temperature-raising step for the second batch or thereafter is short. In this way, the time required for the manufacture per batch may be shortened in comparison with the conventional one.

In the method for manufacturing a negative-electrode carbon material according to the present invention, the chemical vapor deposition treating step is conventionally and publicly known. In other words, the source for carbon vapor deposition comes into contact with the surface of the carbon particles flowed within the chemical vapor deposition furnace by the air flow caused by the stirring blades and an inert gas supplied to the interior of the chemical vapor deposition furnace, along with pyrolyzes, so that the pyrolyzed carbon is chemically vapor-deposited onto the surface of the carbon particles flowing within the chemical vapor deposition furnace. The treatment temperature for the chemical vapor deposition is adjusted preferably between 650 and 1200° C., particularly preferably between 800 and 1050° C. The suitable temperature varies in accordance with the source for carbon vapor deposition used for the chemical vapor deposition. For example, using acetylene as the source for carbon vapor deposition allows the chemical vapor deposition at 650° C. A temperature higher than 1200° C. is not preferable for the treatment for the purpose of surface-coating, because carbon grows up to be filamentous or into soot, rather than growing up to be filmy.

An example of the source for carbon vapor deposition includes an aromatic hydrocarbon including 1 ring to 3 rings such as benzene, toluene, xylene, styrene, ethylbenzene, diphenylmethane, diphenyl, naphthalene, phenol, cresol, nitrobenzene, chlorobenzene, indene, coumarone, pyridine, anthracene or phenanthrene, and a derivative thereof. In addition, a petroleum fractionated oil or naphtha cracked tar oil, or a coal gas light oil, creosote oil or anthracene oil obtained by a tar distillation process may also be used. Furthermore, an aliphatic hydrocarbon such as methane, ethane, propane, butane, pentane or hexane, or an alcohol that is a derivative thereof may also be used. An organic compound having a double bond such as acetylene, ethylene, propylene, isopropylene or butadiene may also be used. These may be used alone or as a mixture. Especially, benzene that does not produce tar at the time of the chemical vapor-depositing treatment, or toluene, xylene, styrene and a derivative thereof are preferable.

In the chemical vapor-depositing treatment, the amount of the pyrolized carbon vapor-deposited onto the surface of carbon particles is adjusted preferably between 0.2 and 30% by mass, more preferably between 3 and 20% by mass, particularly preferably between 10 and 18% by mass with respect to the whole negative-electrode carbon material. When the amount is 0.2% by mass or more, the surface area reduction effect for the negative-electrode material is expressed. It is unpreferable that the amount be more than 30% by mass, because the improving effect for the cell characteristic is almost saturated, as well as adhesion between the particles becomes so predominant that coarsening of the particles is easy to occur.

In the present invention, the non-oxidizing atmosphere means that the oxygen concentration is lower than 5% by volume. The lower oxygen concentration is preferable. The non-oxidizing atmosphere is formed mainly of an inert gas such as nitrogen. In addition, the inert gas is used to discharge oxygen or the unreacted source for carbon vapor deposition from the interior of the chemical vapor deposition furnace, while being important as a fluidizing medium for forming a fluid bed. Accordingly, the source for carbon vapor deposition may be diluted with an inert gas such as nitrogen so as to be introduced to the interior of the chemical vapor deposition furnace. The molar concentration of the source for carbon vapor deposition with respect to an inert gas is preferably from 2 to 50%, more preferably from 5 to 33%.

REFERENCE SIGNS LIST 100, 200, 300: Apparatus for manufacturing negative-electrode carbon material 11: Heat-treatment furnace
13: Stirring blade
15: Motor
17: Carbon-particle supply opening
19: Negative-electrode carbon material recovery opening
21: On-off valve
23: Cooling tank
25: Stirring blade
27: Motor
28: Recovery opening valve
29: Recovery opening
31: Preheating tank
32: Supply pipe
33: On-off valve
211: Chemical vapor deposition furnace
900: Apparatus for manufacturing negative-electrode carbon material
91: Chemical vapor deposition furnace
93: Stirring blade
95: Motor
97: Carbon-particle supply opening
99: Negative-electrode carbon material recovery opening
101: On-off valve
103: Container
a: carbon vapor deposition source supply opening
b: Inert gas supply opening
c: Gas exhaust opening
d: Inert gas supply opening
e: Inert gas supply opening

The invention claimed is:

1. A batchwise apparatus for manufacturing a negative-electrode carbon material for a lithium-ion secondary battery by heat-treating carbon particles while causing the carbon particles to flow within a heat-treatment furnace by the air flow caused by the stirring blades and an inert gas supplied to the interior of the heat-treatment furnace, the apparatus for manufacturing a negative-electrode carbon material for a lithium-ion secondary battery comprising:
    a heat-treatment furnace provided with a carbon-particle supply opening for supplying the carbon particles to an interior, a negative-electrode carbon material recovery opening for taking out the negative-electrode carbon material from the interior, stirring blades driven by a motor, an inert gas supply opening for supplying an inert gas to the interior of the heat-treatment furnace, and a gas exhaust opening for exhausting a gas within the heat-treatment furnace to the exterior of the furnace; and
    a cooling tank connected in an airtight manner via an on-off valve to the negative-electrode carbon material recovery opening of the heat-treatment furnace, provided with a cooling jacket for cooling the interior of the cooling tank by a refrigerant flowing within the cooling jacket and stirring blades driven by a motor, and an inert gas supply opening for supplying an inert gas to the interior of the cooling tank, wherein the number of the heat-treatment furnace present in the apparatus is one.

2. The apparatus according to claim 1, wherein the heat-treatment furnace is a carbonizing furnace or a chemical vapor deposition furnace.

3. The apparatus according to claim 1, wherein, to the carbon-particle supply opening, a preheating tank provided with a means that preliminarily heats the carbon particles under a non-oxidizing atmosphere is connected via an on-off valve.

* * * * *